United States Patent
Chiba et al.

(10) Patent No.: US 11,904,358 B2
(45) Date of Patent: Feb. 20, 2024

(54) DIELECTRIC ELASTOMER TRANSDUCER

(71) Applicants: Seiki Chiba, Tokyo (JP); Mikio Waki, Sakura (JP); ZEON CORPORATION, Tokyo (JP)

(72) Inventors: Seiki Chiba, Tokyo (JP); Mikio Waki, Sakura (JP); Mitsugu Uejima, Tokyo (JP); Makoto Takeshita, Tokyo (JP)

(73) Assignees: Seiki Chiba, Tokyo (JP); Mikio Waki, Sakura (JP); ZEON CORPORATION, Tokyo (JP)

( * ) Notice: Subject to any disclaimer, the term of this patent is extended or adjusted under 35 U.S.C. 154(b) by 312 days.

(21) Appl. No.: 17/596,762

(22) PCT Filed: Jun. 17, 2020

(86) PCT No.: PCT/JP2020/023695
§ 371 (c)(1),
(2) Date: Dec. 17, 2021

(87) PCT Pub. No.: WO2020/262129
PCT Pub. Date: Dec. 30, 2020

(65) Prior Publication Data
US 2022/0314276 A1 Oct. 6, 2022

(30) Foreign Application Priority Data

Jun. 24, 2019 (JP) .................................. 2019-116435

(51) Int. Cl.
*B06B 1/02* (2006.01)
(52) U.S. Cl.
CPC .................................. *B06B 1/0292* (2013.01)
(58) Field of Classification Search
CPC .................................. B06B 1/02; B06B 1/0292
(Continued)

(56) References Cited

U.S. PATENT DOCUMENTS

2008/0203850 A1* 8/2008 Martineau ................ H02N 2/18
310/309
2008/0224564 A1* 9/2008 Pelrine .................... C09J 175/04
310/309

(Continued)

FOREIGN PATENT DOCUMENTS

JP  2008251833 A  10/2008
JP  2015189776 A  11/2015

(Continued)

OTHER PUBLICATIONS

Sep. 15, 2020, International Search Report issued in the International Patent Application No. PCT/JP2020/023695.

(Continued)

*Primary Examiner* — Rashad H Johnson
(74) *Attorney, Agent, or Firm* — KENJA IP LAW PC

(57) ABSTRACT

A dielectric elastomer transducer according to the present invention includes a dielectric elastomer layer, and a pair of electrode layers sandwiching the dielectric elastomer layer. The electrode layers contain a binder and carbon black. The carbon black has a particle size distribution as measured by dynamic light scattering in which not less than 95% falls in a range of 0.15 to 8.0 μm. The carbon black has a particle size as measured by laser scattering ranging from 0.4 to 50 μm. The particle size distribution of the carbon black as measured by dynamic light scattering has a first peak that falls in a first range of 0.15 to 1.0 μm and a second peak that falls in a second range of 1.0 μm to 8.0 μm. This structure achieves both stretchability and electrical conductivity of the electrode layers.

2 Claims, 2 Drawing Sheets

(58) Field of Classification Search
USPC .......................................................... 310/309
See application file for complete search history.

(56) References Cited

U.S. PATENT DOCUMENTS

| | | | | |
|---|---|---|---|---|
| 2009/0208250 A1* | 8/2009 | Mitsumori | ........... | G03G 5/0564 |
| | | | | 430/65 |
| 2010/0158561 A1* | 6/2010 | Mitsumori | ............. | G03G 15/75 |
| | | | | 430/60 |
| 2012/0177934 A1* | 7/2012 | Vogel | ....................... | H01M 4/13 |
| | | | | 977/734 |
| 2013/0293063 A1* | 11/2013 | Takamatsu | ........... | H02N 11/006 |
| | | | | 310/309 |
| 2014/0004364 A1* | 1/2014 | Takahashi | .................. | C08J 5/18 |
| | | | | 428/465 |
| 2014/0202745 A1 | 7/2014 | Kobayashi et al. | | |
| 2014/0338458 A1* | 11/2014 | Wang | ..................... | G01H 11/06 |
| | | | | 310/309 |
| 2018/0277909 A1* | 9/2018 | Harada | ................ | H01M 10/056 |
| 2021/0343484 A1* | 11/2021 | Fukui | ....................... | C08K 9/02 |
| 2022/0314276 A1* | 10/2022 | Chiba | ................... | B06B 1/0292 |

FOREIGN PATENT DOCUMENTS

| | | |
|---|---|---|
| JP | 2017034923 A | 2/2017 |
| KR | 101615053 B1 | 4/2016 |
| TW | 201145770 A | 12/2011 |

OTHER PUBLICATIONS

Jun. 19, 2023, the Extended European Search Report issued by the European Patent Office in the corresponding European Patent Application No. 20831571.3.

* cited by examiner

DIELECTRIC ELASTOMER TRANSDUCER

TECHNICAL FIELD

The present invention relates to a dielectric elastomer transducer.

BACKGROUND ART

A dielectric elastomer transducer, which includes a dielectric elastomer layer sandwiched between a pair of electrode layers, is expected to find a variety of applications such as actuation, power generation and sensing. An example of a conventional dielectric elastomer transducer is disclosed in Patent Document 1. In this document, silver nanowires, carbon nanowires, carbon nanotubes, carbon nanofillers, etc. are recited as the constituent materials of the electrode layers.

PRIOR ART DOCUMENT

Patent Document

Patent Document 1: JP-A-2017-34923

SUMMARY OF THE INVENTION

Problems to be Solved by the Invention

Dielectric elastomer transducers are generally used on the premise that the dielectric elastomer layer exhibits a high stretchability. Thus, the electrode layers need to have enough stretchability to follow the dielectric elastomer layer. At the same time, the electrode layers are the parts to which an electric charge (voltage) is applied, and it is necessary to avoid the electrode layers becoming electrically insulated due to expansion and contraction.

The present invention has been conceived in view of the circumstances described above and aims to provide a dielectric elastomer transducer that achieves both stretchability and electrical conductivity.

Means for Solving the Problems

A dielectric elastomer transducer provided by the present invention includes a dielectric elastomer layer, and a pair of electrode layers sandwiching the dielectric elastomer layer. The electrode layers contain a binder and carbon black. The carbon black has a particle size distribution as measured by dynamic light scattering in which not less than 95% falls in a range of 0.15 to 8.0 μm. The carbon black has a particle size as measured by laser scattering ranging from 0.4 to 50 μm. The particle size distribution of the carbon black as measured by dynamic light scattering has a first peak that falls in a first range of 0.15 to 1.0 μm and a second peak that falls in a second range of 1.0 μm to 8.0 μm.

In a preferred embodiment of the present invention, the second peak is higher than the first peak.

Advantages of the Invention

The prevent invention provides a dielectric elastomer transducer that achieves both stretchability and electrical conductivity.

Other features and advantages of the present invention will become clearer from the detailed description given below with reference to the accompanying drawings.

MODE FOR CARRYING OUT THE INVENTION

Preferred embodiments of the present invention are described below with reference to the accompanying drawings.

Figure 1:
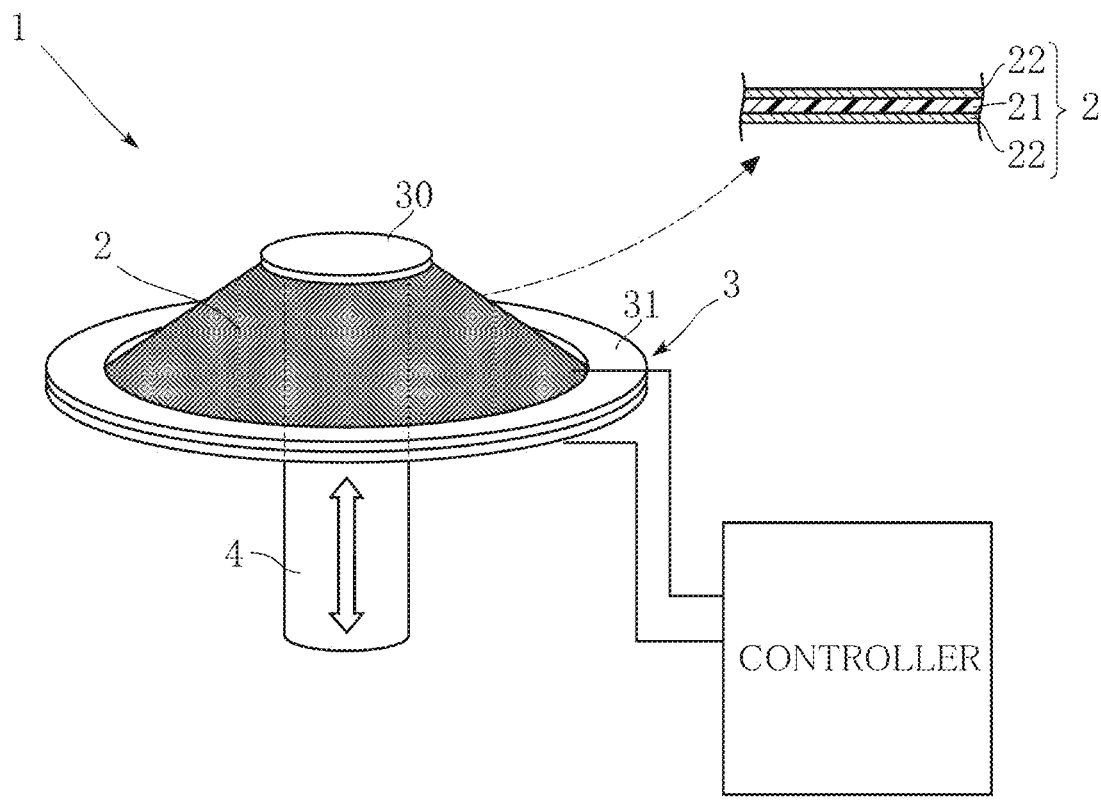
FIG. 1 is a perspective view showing an example of a dielectric elastomer transducer according to the present invention.

FIG. 1 shows an example of a dielectric elastomer transducer according to the present invention. The illustrated transducer 1 includes a dielectric elastomer element 2, a support 3 and a rod 4. The dielectric elastomer element 2 has a dielectric elastomer layer 21 and a pair of electrode layers 22. The dielectric elastomer layer 21 needs to be elastically deformable and have a high dielectric strength. Preferable examples of such a material for the dielectric elastomer layer 21 include, but not limited to, silicone elastomers, acrylic elastomers and styrene elastomers. The dielectric elastomer layer 21 has a circular or annular shape in the illustrated example, but is not limited to this.

The pair of electrode layers 22, which sandwich the dielectric elastomer layer 21, are subjected to voltage application. The electrode layers 22 are made of a material that is electrically conductive and also elastically deformable so as to follow the elastic deformation of the dielectric elastomer layer 21. Examples of such a material include an elastically deformable material mixed with a filler that imparts conductivity. Examples of the elastically deformable material include polymer-based materials and grease materials. In the present embodiment, carbon black having the particle size distribution described later, for example, is used as the filler. The electrode layers 22 have a circular or annular shape in the illustrated example, but are not limited to this.

The support 3 is a support structure that supports the dielectric elastomer element 2 in a desired state. The support 3 includes a support disk 30 and a support ring 31. Preferably, the support disk 30 and the support ring 31 are made of an insulating material such as resin. The support disk 30 supports the central part of the dielectric elastomer element 2. The support ring 31 supports the peripheral part of the dielectric elastomer element 2.

The rod 4 is a shaft that outputs a driving force when the transducer 1 is used as an actuator and receives an external force when the transducer 1 is used as a power generation device. In the illustrated example, the rod 4 is fixed to the support disk 30 at one end.

Figure 2:
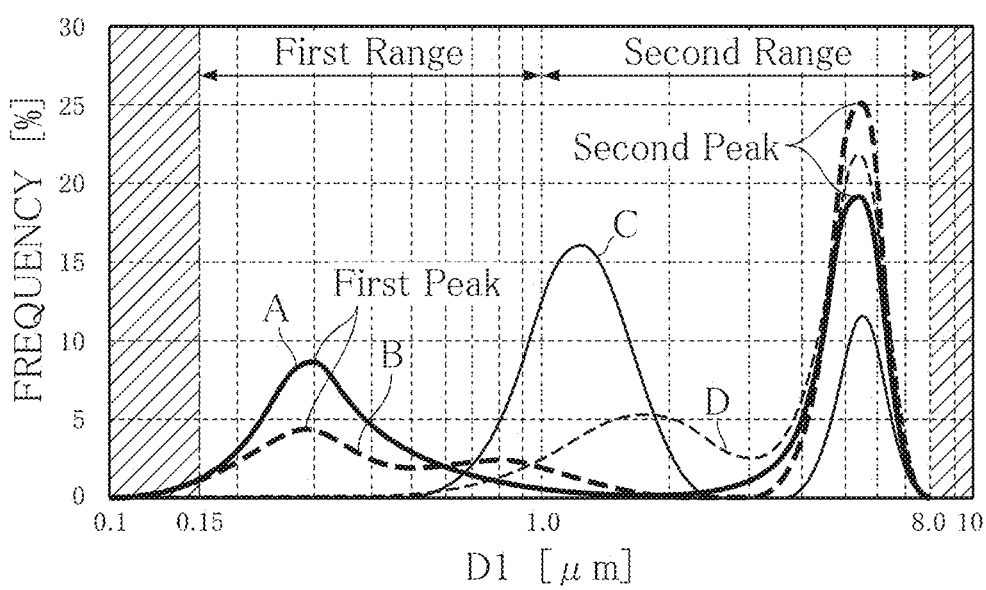
FIG. 2 is a graph showing a particle size distribution measured by dynamic light scattering.
Figure 3:
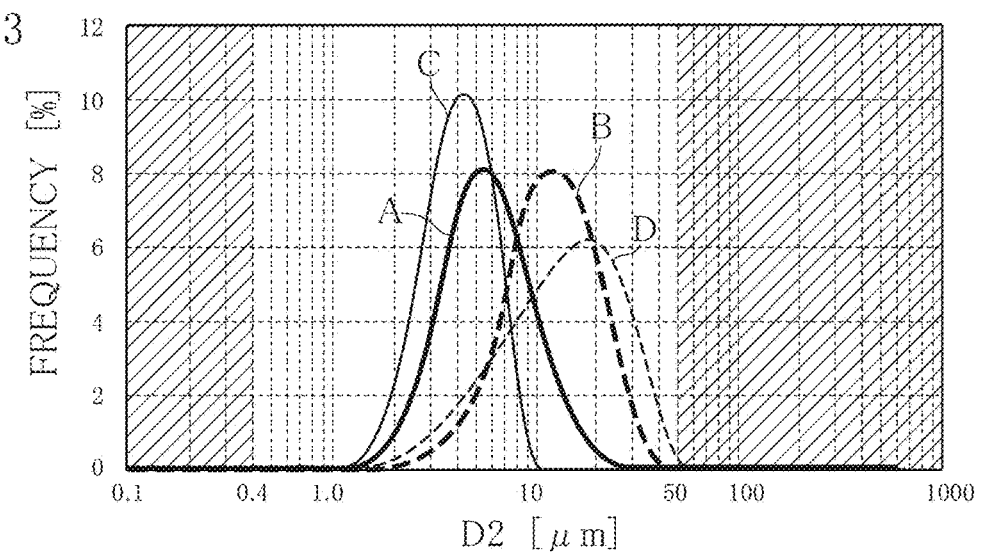
FIG. 3 is a graph showing a particle size distribution measured by laser scattering.

FIG. 2 shows the particle size distribution of carbon black used for the electrode layers 22, as measured by dynamic light scattering. FIG. 3 shows the particle size distribution as measured by laser scattering. Measurements by dynamic light scattering and laser scattering were performed as follows.

A carbon black dispersion or solution was prepared by dispersing carbon black in CyH as a solvent.

(Pre-Dilution Before Particle Size Measurement)

(1-1) 2 ml of dispersion of each selected type of carbon black was collected in a glass vessel, and isopropyl alcohol (IPA: Kanto Chemical, Cica Grade 1) was added to obtain a pre-diluted solution.

(1-2) The pre-diluted solution in each vessel was stirred with e.g., a magnetic stirrer, and subjected to ultrasonication under the following conditions: the ultrasonic frequency of 39 kHz, the output power of 100 W, and the irradiation time of 3 minutes.

(1-3) The particle size measurements noted below were performed within 10 minutes after the ultrasonication.

<Dynamic Light Scattering Method>

(2-1) For measurements by dynamic light scattering, a measuring device of Zetasizer Nano series available from Malvern was used. The device was appropriately calibrated in advance using size standard particles (LTX3060A, LTX3200A) to reduce measurement errors to the order of 2% or less.

(2-2) A volume of 1 ml of each pre-diluted solution was put into a 12 mm square glass cell (PSC1115), and the cell was inserted into the device. Each glass cell was closed with a cap.

(2-3) For the particle type settings, the refractive index was set at 2.0, and the imaginary part was set at 0.850.

(2-4) For the solvent type settings, 2-Propanol was selected, the refractive index was set at 1.3750, and the viscosity was set at 2.038.

(2-5) The measurement temperature was set at 25° C.

(2-6) Each measurement was set to start 60 seconds after the measurement temperature was reached.

(2-7) The cell type was set to select "glass cuvette".

(2-8) The detector angle for measurement was set at 173°.

(2-9) The duration of each measurement was set to select "Automatic".

(2-10) The number of times to repeat measurement was set at 3.

(2-11) The "Measurement Position" setting was set to select "Seek for measurement position" to automatically determine an appropriate position.

(2-12) The model for smoothing the particle size distribution was set to select "General Purpose".

(2-13) Z-Average was selected to take the average of three measurements as a measurement value.

<Laser Scattering Method>

(3-1) For measurement by laser scattering, Mastersizer 3000 available from Malvern was used as a measurement device.

(3-2) For the particle type settings, the refractive index was set at 2.0, and the imaginary part was set at 0.850.

(3-3) For solvent type settings, ethanol was selected, and the refractive index was set at 1.3600.

(3-4) Ethanol (Kanto Chemical, Cica Grade 1) was used as the dispersant in the measurements.

(3-5) A prescribed amount of ethanol was charged into a dispersion unit of the device and the unit was circulated in the device for 120 seconds.

In FIGS. 2 and 3, Example A uses VULCAN XCR72R available from CABOT, and Example B uses Blackpearls 2000 available from CABOT. Example A has a nominal particle size of 30 nm and a nominal specific surface area of 254 $m^2/g$. Example B has a nominal particle size of 15 nm and a nominal specific surface area of 1475 $m^2/g$. Comparative Example C uses #3030B available from Mitsubishi Chemical Corporation, and Comparative Example D uses TOKABLACK #5500 available from Tokai Carbon Co, Ltd. Example C has a nominal particle size of 55 nm and a nominal specific surface area of 29 $m^2/g$. Example D has a nominal particle size of 25 nm and a nominal specific surface area of 225 $m^2/g$.

As shown in FIG. 2, in both of Examples A and B, not less than 95% falls in the range of 0.15 to 8.0 µm in the distribution of the particle size D1 as measured by dynamic light scattering. Not less than 95% falling in the above-mentioned range means that in the particle size measurement of the objects, the frequency of the measurement results falling in the above-mentioned range is not less than 95%. Also, as shown in FIG. 3, in both of Examples A and B, the particle size D2 as measured by laser scattering ranges from 0.4 to 50 µm. Moreover, as shown in FIG. 2, in both of Examples A and B, the distribution of the particle size D1 as measured by dynamic light scattering has a first peak that falls in a first range of 0.15 to 1.0 µm and a second peak that falls in a second range of 1.0 to 8.0 µm. In both of Examples A and B, the second peak is higher than the first peak.

In contrast, as shown in FIG. 2, Examples C and D each have a peak that falls in the second range but have no peak in the first range.

Advantages of the transducer 1 are described below.

In Examples A, B and Comparative Examples C and D, not less than 95% falls in the range of 0.15 to 8.0 µm in the distribution of the particle size D1 as measured by dynamic light scattering, and the particle size D2 as measured by laser scattering ranges from 0.4 to 50 µm. Moreover, the distribution of the particle size D1 as measured by dynamic light scattering has a first peak that falls in a first range of 0.15 to 1.0 µm and a second peak that falls in a second range of 1.0 to 8.0 µm. Experiments by the inventors confirmed that Examples A and B having the above features provide a high conductivity and a high elasticity.

Figure 4:
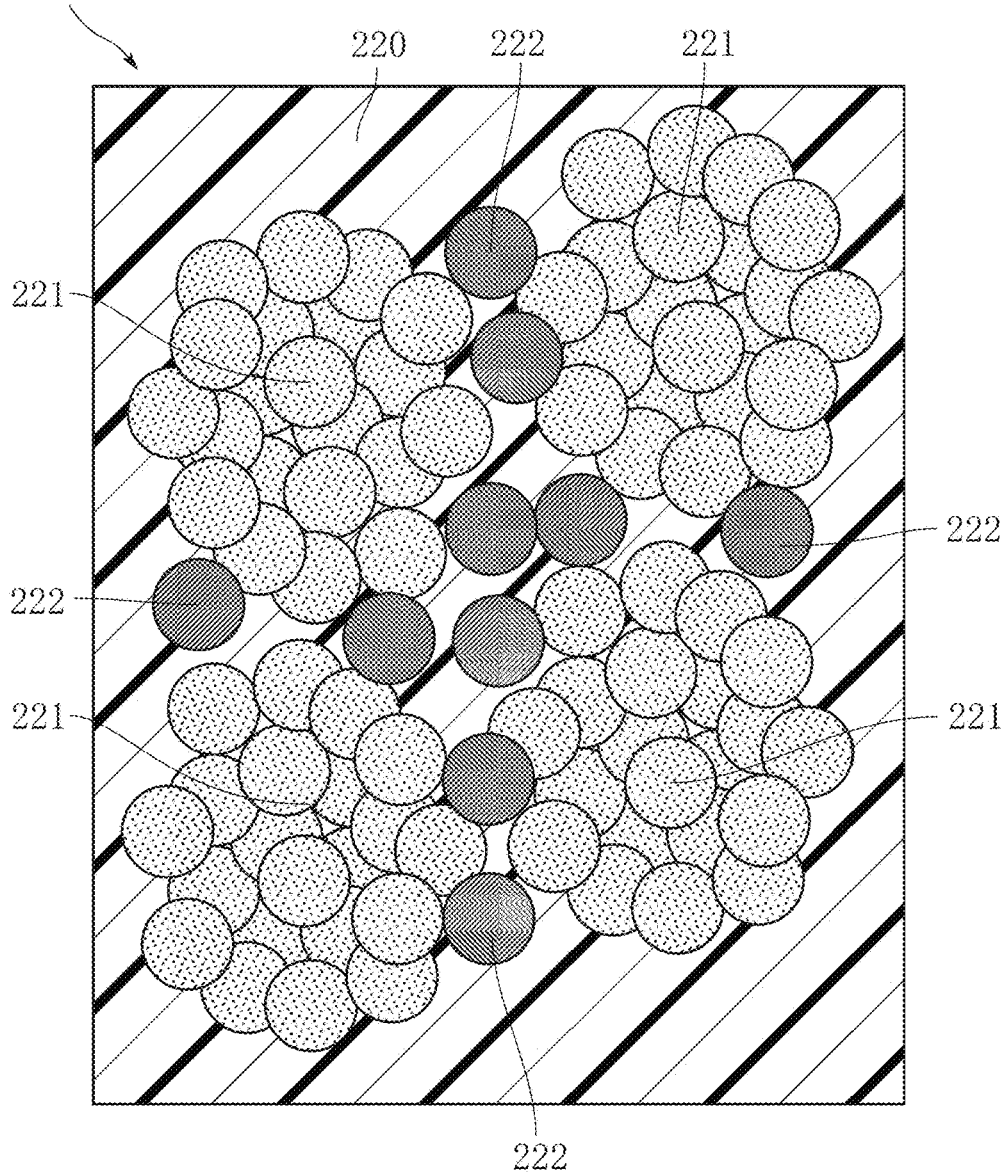
FIG. 4 is a schematic enlarged view of a part of an electrode layer.

The electrode layers 22 are considered to have an internal structure as shown in FIG. 4. The electrode layers 22 contain carbon blacks 221 and 222 in a binder 220. Carbon blacks 221 each are an aggregate, formed by e.g. cohesion, of a plurality of carbon black particles and correspond to the particle size D1 of the second peak in the second range mentioned above. Carbon blacks 222 each are a single carbon black particle or an aggregate of a relatively small number of carbon black particles and correspond to the particle size D1 of the first peak in the first range mentioned above. Conceivably, the gaps between carbon blacks 221 having a relatively large particle size D1 are filled with carbon blacks 222 having a relatively small particle size D1. With such a structure, even when the electrode layers 22 are elastically deformed significantly, conduction between carbon blacks 221 is ensured by carbon blacks 222. Conceivably, this is the reason that a high conductivity and a high elasticity are confirmed for Examples A and B.

The second peak in the second range being higher than the first peak in the first range means that carbon blacks 221 are contained in a larger amount than carbon blacks 222. Containing carbon blacks 221, which contribute to fundamental conduction and maintaining elasticity of the electrode layers 22, in a large amount is favorable for improving conductivity and elasticity.

The dielectric elastomer transducer according to the present invention is not limited to the foregoing embodiments. The specific configuration of each part of the dielectric elastomer transducer according to the present invention may be varied in design in many ways.

The invention claimed is:

1. A dielectric elastomer transducer comprising:
   a dielectric elastomer layer; and
   a pair of electrode layers sandwiching the dielectric elastomer layer, wherein
   the electrode layers contain a binder and carbon black, the carbon black having a particle size distribution as measured by dynamic light scattering in which not less than 95% falls in a range of 0.15 to 8.0 μm, the carbon black having a particle size as measured by laser scattering ranging from 0.4 to 50 μm, and the particle size distribution of the carbon black as measured by dynamic light scattering having a first peak that falls in a first range of 0.15 to 1.0 μm and a second peak that falls in a second range of 1.0 μm to 8.0 μm.

2. The dielectric elastomer transducer according to claim 1, wherein the second peak is higher than the first peak.

* * * * *